US005170160A

United States Patent [19]
Cooperman et al.

[11] Patent Number: 5,170,160
[45] Date of Patent: Dec. 8, 1992

[54] BROADBAND TREE SWITCH ARCHITECTURE FOR REDUCING PULSE WIDTH NARROWING AND POWER DISSIPATION

[75] Inventors: Michael Cooperman, Framingham; Richard W. Sieber, Attleboro; Arnold Paige, Natick, all of Mass.

[73] Assignee: GTE Laboratories Incorporated, Waltham, Mass.

[21] Appl. No.: 759,731

[22] Filed: Aug. 12, 1991

Related U.S. Application Data

[63] Continuation of Ser. No. 351,632, May 9, 1989, abandoned.

[51] Int. Cl.[5] ............................................. H04Q 1/00
[52] U.S. Cl. .............................. 340/825.870; 307/243; 340/825.8; 340/826
[58] Field of Search ........... 340/825.87, 825.8, 825.85, 340/825.89, 826, 825.02, 825.03; 379/271,272; 307/241, 243, 244, 239

[56] References Cited

U.S. PATENT DOCUMENTS

| 3,614,327 | 10/1971 | Low . | |
|---|---|---|---|
| 4,453,096 | 6/1984 | Le Can et al. | 307/243 |
| 4,593,390 | 6/1986 | Hildebrand et al. | 307/243 |
| 4,716,308 | 12/1987 | Matsuo et al. | 307/303 |
| 4,800,295 | 1/1989 | Minuhin et al. | 307/265 |
| 4,825,105 | 4/1989 | Hölzle | 307/243 |
| 4,849,751 | 7/1989 | Barber et al. | 307/243 |

FOREIGN PATENT DOCUMENTS

| 60-201795 | 2/1986 | Japan . | |
|---|---|---|---|
| 61-65623 | 8/1986 | Japan . | |
| 0731593 | 4/1980 | U.S.S.R. | 307/243 |

OTHER PUBLICATIONS

Palounek, IBM Technical Disclosure Bulletin, "Read-Only Storage Unit," vol. 13, No. 9, Feb., 1971, pp. 2557-2558.

Hill & Peterson, "Switching Theory and Logical Design," 1974, p. 194.

Lenk, "Handbook of Digital Electronics," 1981, p. 50.
Castellucis, "Pulse and Logic Circuits," 1976, p. 82.
Shoji, "Elimination of Process–Dependent Clock Skew in CMOS VLSI," Oct. 1986, IEEE Journal of Solid-State Circuits, vol. SC-21, No. 5, pp. 875-880.

(List continued on next page.)

Primary Examiner—Donald J. Yusko
Assistant Examiner—Peter Weissman
Attorney, Agent, or Firm—Victor F. Lohmann, III

[57] ABSTRACT

A broadband space tree-switch matrix establishes a desired switching path by sensitizing only the sequence of logic gates defined by the desired path such that only these sensitized logic gates are operable to undergo switching and thereby permit transmission of only the corresponding input signal. The tree-switch includes a plurality of cascaded stages wherein the first stage consists of dual-input NAND gates each receiving a corresponding input signal at one input and a control signal at another input. The remaining stages include a plurality of switching nodes each having a first NAND gate cascaded to a second NAND gate wherein the second NAND gate has a HIGH steady-state logic signal present at one of its inputs. An appropriate combination of control signals are applied to the NAND gates in the first stage to effect a selected switching path. A second broadband space switch matrix comprises a plurality of NAND gates arranged into a series of cascaded stages to form a tree-switch configuration. The first and second stages include equal numbers of NAND gates corresponding to the number of input signals. Furthermore, the NAND gates in only the first and second stages each have a control input for receiving control signals to establish a selected path. The tree-switch likewise operates to sensitize a particular path in response to the control signals so that only the NAND gates in the selected path are operable to undergo switching.

3 Claims, 3 Drawing Sheets

OTHER PUBLICATIONS

Sunazawa et al., "Low Power CML IC Cross-Point Switch Matrix for Spare Division Digital Switching Neworks" IEEE Journal of Solid State Circuits, vol. SC-10, No. 2, Apr./1975, pp. 117-122.

IBM Tech. Disclosure Bull. "CMOS Self-Decoding Complementary Pass-Gate Multiplexer", vol. 28, No. 3 (Aug. 1985) pp. 1302-1303.

"Logic Design", Holdsworth et al., Wireless World, vol. 84, No. 1507, (Mar. 1978), pp. 47-50.

N. H. E. Weste et al., "CMOS Circuit and Logic Design," Prin. of CMOS VLSI Design, pp. 172-203 (1985).

Pasternak et al., "CMOS Differential Pass-Transistor Logic Design", IEEE Journal of Solid State Circuits, vol. SC-22 No. 2, pp. 216-222 (1987) Apr.

Hayano et al., "GaAs 8×8 Matrix Switch LSI for High-Speed Digital Communications," IEEE Gallium Arsenide IC Symposium, pp. 245-248 (Oct. 1987).

S. Whitaker, "Pass-Transistor Networks Optimize n-MOS Logic", Elec., vol.-56, No. 19, pp. 144-148 (Sep. 1983).

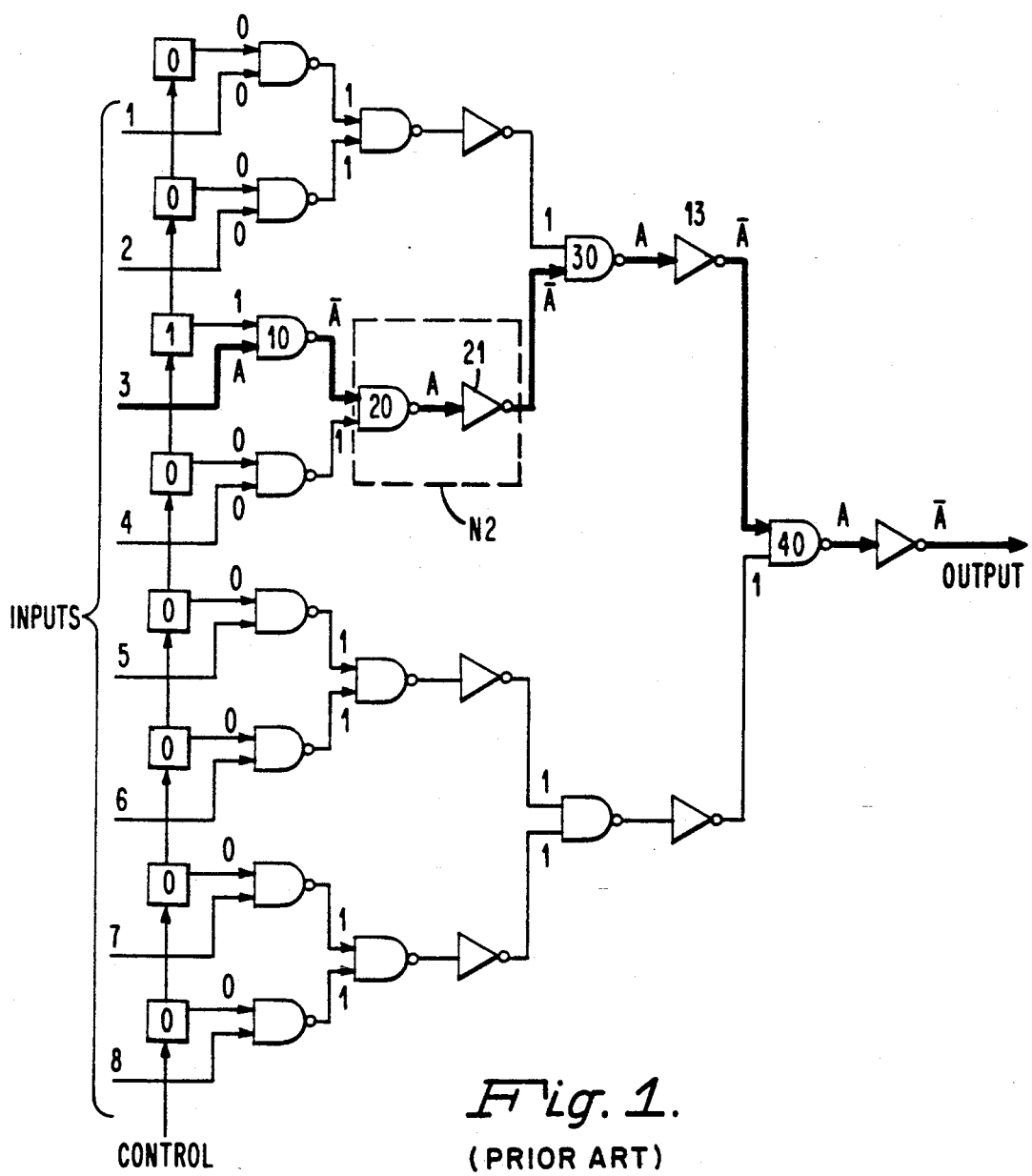
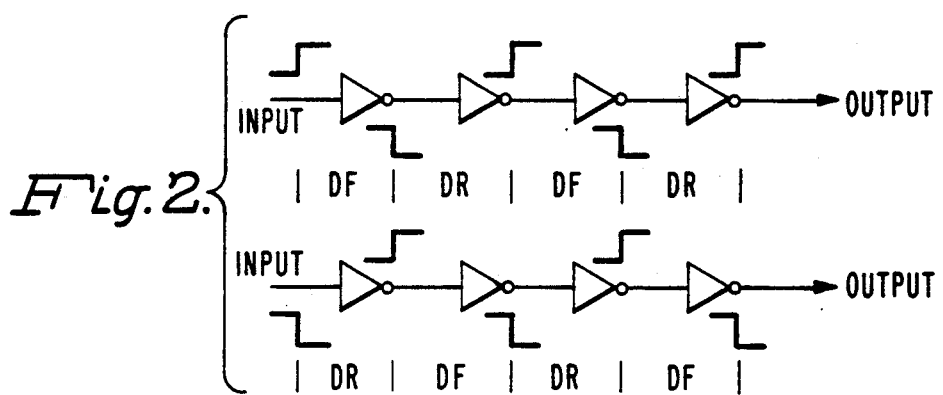
Fig. 1.
(PRIOR ART)
Fig. 2.

BROADBAND TREE SWITCH ARCHITECTURE FOR REDUCING PULSE WIDTH NARROWING AND POWER DISSIPATION

This is a continuation of copending application Ser. No. 07/351,632 filed on May 9, 1989, now abandoned.

CROSS-REFERENCES TO RELATED APPLICATIONS

The present application is copending with an application entitled "BROADBAND SWITCH USING DEACTIVATED CROSSPOINTS FOR ESTABLISHING SWITCHING PATHS," filed May 4, 1989 by the inventors of this application and assigned to the same assignee as this application.

FIELD OF THE INVENTION

This invention relates to broadband space switch matrices and, more particularly, to a novel tree-switch architecture which sensitizes a selected switching path in the matrix so that only the gates in the chosen path are operable to perform switching and thereby provide transmission of only a selected input signal.

BACKGROUND OF THE INVENTION

There are current efforts in the telecommunications industry to provide broadband video services utilizing high performance technology at low cost. CMOS technology has the potential to provide broadband switching at low cost due to its high speed, high density, and low power dissipation.

The performance of broadband switches implemented in CMOS is affected by the specific configuration. In particular, a majority of conventional CMOS space switches encounter size and speed limitations due to stray capacitances in the array crosspoints. A relatively new switch architecture having a tree-switch configuration has been introduced recently that overcomes the aforecited limitations by isolating each crosspoint from the stray capacitances in the array. The configurations for implementing these tree-switches offer improvements in speed, chip area economy, and power dissipation. One such configuration is the 64×17 non-blocking crosspoint switch disclosed by Barber et al. at the 1988 IEEE International Solid-State Circuits Conference and is illustrated for exemplary purposes as an 8×1 tree-switch in FIG. 1.

As shown in FIG. 1, the tree-switch is constructed as a series of cascaded stages wherein the first stage consists of NAND gates each receiving an input signal and the remaining stages are comprised of switching nodes N2 having a NAND gate 20 cascaded to an inverter 21. A desirable feature of this switch is that each switching node drives only one other switching node in a following stage, thereby providing high speed. The control is relatively simple in that only the NAND gates in stage No. 1 receive control signals to effect a desired propagation path. For example, the combination of control signals as indicated in FIG. 1 are applied to stage No. 1 to sensitize the path through gates 10, 20, 30 and 40 so that only input signal 3 can propagate through the switch. Since only the gates in the sensitized path are operable to be switched due to the control signals, low power dissipation is possible.

Disadvantageously, an input signal propagating through the Barber et al. switch experiences an undesirable delay due to the cascaded sequence of NAND gate and associated inverter in each stage of the switch. Furthermore, the input signal is susceptible to pulse narrowing since rising and falling inputs could be treated differently by the cascaded sequence of NAND gate and inverter.

Regarding pulse-width narrowing, it is impossible for the rise and fall delay to stay exactly the same with variations in process, supply voltage, and environmental tolerances. Consequently, an unequal rise and fall delay causes the bit element pulse to shrink or expand thereby reducing operating speed. For example, if every stage produced a pulse shrinkage of 0.2 ns, then the 13 cascaded stages in a 64×1 input switch would cause a pulse shrinkage of 13×0.2=2.6 ns. Thus, an input pulse of 7 ns (corresponding to 150 Mb information rate) would shrink at the output to 4.4 ns. This would prevent one 64 module from driving the next without reclocking the output. and expanding the 4.4 ns pulses back to 7 ns. In FIG. 1, constant pulse width is difficult to achieve because, for example, a rising edge at input 3 will appear as a rising edge at gate 3. Since gate 3 is an inverter and not identical to gate 2, there cannot be exact compensation of rise and fall delay.

OBJECTS OF THE INVENTION

Accordingly, it is a primary object of this invention to obviate the above noted and other disadvantages of the prior art.

It is a further object of this invention to provide a broadband space tree-switch matrix having high switching speed and very low power dissipation.

It is a yet further object of this invention to provide a broadband space tree-switch matrix that is immune to pulse-width narrowing.

SUMMARY OF THE INVENTION

The above and other objects and advantages are achieved in one aspect of this invention by an N×1 broadband space tree-switch matrix which establishes a desired switching path for an input digital signal. The tree-switch includes a plurality of cascaded stages wherein the first stage consists of NAND gates each receiving a corresponding input signal and the remaining stages comprise a plurality of switching nodes each having first and second dual-input NAND gates cascaded together wherein the output of the first NAND gate is connected to one input of the second NAND gate and the other input of the second NAND gate is at a HIGH steady-state logic level. The stages are interconnected so that each NAND gate output drives only a single NAND gate input in a following stage. A means for establishing a selected switching path applies an appropriate combination of control signals to the NAND gates in the first stage. The net result of said establishing means is that only the NAND gates in the selected path are operable to undergo switching, thereby allowing only the corresponding input signal to propagate through the switch.

In another aspect of the present invention, an N×1 space tree-switch matrix comprises a first selection stage, a second selection stage cascaded to said first selection stage, and a plurality of cascaded stages arranged into a multiplexing configuration and coupled to said second selection stage. Each stage is comprised of NAND gates wherein the gates in only the first and second selection stage have a control input for receiving...control.. signals. The stages are interconnected so that each NAND gate output drives only a single NAND gate input in a following stage. A means for establishing a desired switching path applies an appropriate combination of control signals to the control inputs of the NAND gates in said first, and second selection stage. The establishing means permits only the NAND gates in the selected path to undergo switching, thereby allowing only the corresponding input signal to propagate through the switch.

BRIEF DESCRIPTION OF THE DRAWINGS

FIG. 1 is a prior art circuit diagram of an 8×1 tree-switch matrix;

FIG. 2 shows a pair of inverter circuits illustrating the effect of cascaded inversion on an input signal having both a rising and falling edge;

DETAILED DESCRIPTION OF PREFERRED EMBODIMENT

The prior art tree-switch matrix in FIG. 1 is shown as an 8×1 switch for exemplary purposes. The four stages comprising the matrix operate in a cascaded tree configuration to accept eight input signals through the NAND gates in stage No. 1 and provide a selected one of the signals in accordance with the control signals applied to the NAND gates in stage No. 1. The bit pattern of control signals as shown in FIG. 1 enable signal A entering input 3 to propagate through the switch. Each switching node N2 in the remaining stages after stage No. 1 includes a NAND gate 20 cascaded to an inverter 21. As mentioned hereinbefore, there cannot be exact compensation of rise and fall delay in the switching node N2 due to the different switching delays of NAND gate 20 and inverter 21.

When a digital signal propagates through a chain of identical inverting logic gates such as those shown in the circuit diagrams of FIG. 2, the pulse width of the signal is unaffected even when the rise delay (DR) and the fall delay (DF) are not equal. This is due to the fact that the sums of DF's and DR's are the same for both rising inputs and for falling inputs. In contradistinction, the switching nodes in FIG. 1 cause pulse-width narrowing.

Figure 3:
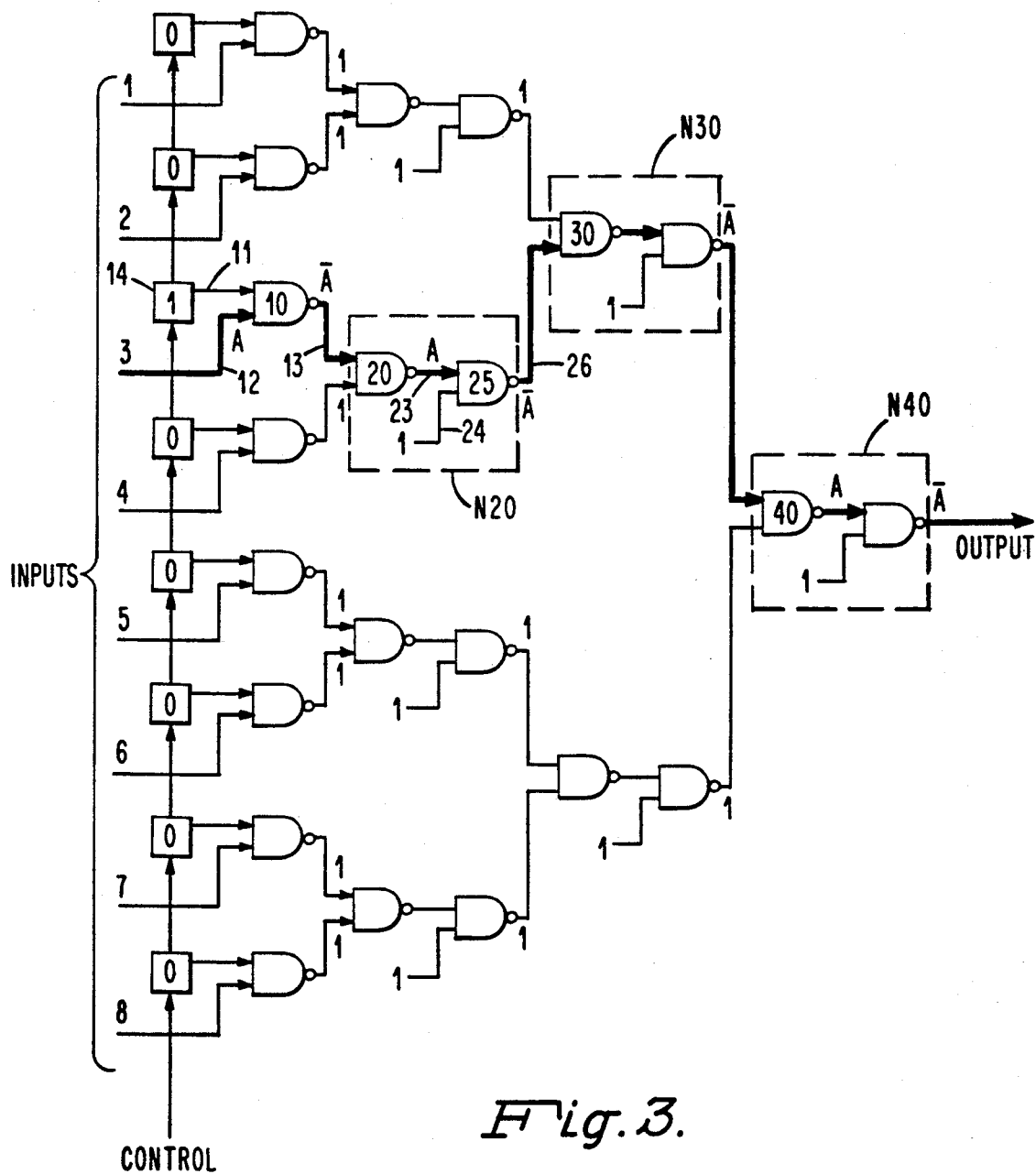
FIG. 3 shows an 8×1 tree-switch matrix in accordance with one embodiment of the present invention.

In one embodiment of the present invention as shown in FIG. 3, the logic circuits of FIG. 2 are incorporated into a novel tree-switch configuration having improvements to the prior art switch of FIG. 1. The tree-switches of FIG. 1 and FIG. 3 are similar in construction and operation except that where each switching node N2 in FIG. 1 includes a cascaded sequence of NAND gate 20 and inverter 21, a representative switching node N20 in FIG. 3 includes a first NAND gate 20 cascaded to an identical second NAND gate 25. The advantage of replacing the inverter with a NAND gate is that the cascaded sequence of NAND gates avoids the problem of pulse-width narrowing present in FIG. 1.

The array in FIG. 3 has a plurality of stages configured as a tree matrix wherein stage No.1 includes NAND gates each connected to an input port and the remaining stages consist of switching nodes which are constructed as described above. In stage No.1, a representative NAND gate 10 has one input 12 connected to input port 3 and a second input 11 through which control signals such as signal 14 are coupled to gate 10. Each other NAND gate in stage No.1 likewise has an input dedicated to receiving control signals. Switching node N20, being representative of the other switching nodes in the matrix, has the output of its first gate 20 connected to a first input 23 of the associated second gate 25 wherein output 26 of gate 25 drives a single input of a first NAND gate 30 in the following stage No. 3. As is the case in every switching node, a HIGH steady-state logic signal is present at a control input 24 of second gate 25 for ensuring that gate 25 is always operable to undergo switching.

The tree-switch in FIG. 3 operates in response to the control signals applied to the NAND gates in stage No. 1 to establish a desired switching path between one of the input ports and the output of switching node N40 in stage No.4. The selected path is established according to the appropriate set of control signals such that only the NAND gates in the selected path are operable to undergo switching, while the other NAND gates in the matrix are forced into steady-state logic levels. The particular control signals indicated in FIG. 3 enable signal A to propagate through the switch while preventing unwanted signals entering the other input ports from proceeding past stage No. 1. Although a shift register is shown in FIG. 3 to indicate how the control signals are presented to the first stage of the switch, other means for applying control signals would be obvious to those skilled in the art.

A problem may exist in the tree-switch of FIG. 3 when a switching node such as node N20 has its first gate 20 and the associated second gate 25 both part of the same switching node since this might result in the connection from gate 20 to gate 25 being shorter than the connection from gate 25 to gate 30 of switching node N30 in the following stage No. 3, thereby making the effective gates non-identical. This problem is avoided in the switch of FIG. 3 by making the connection from gate 20 to gate 25 as long as that from gate 25 to gate 30. This requirement regarding connection lengths is likewise implemented in each other switching node of the tree-switch.

Figure 4:
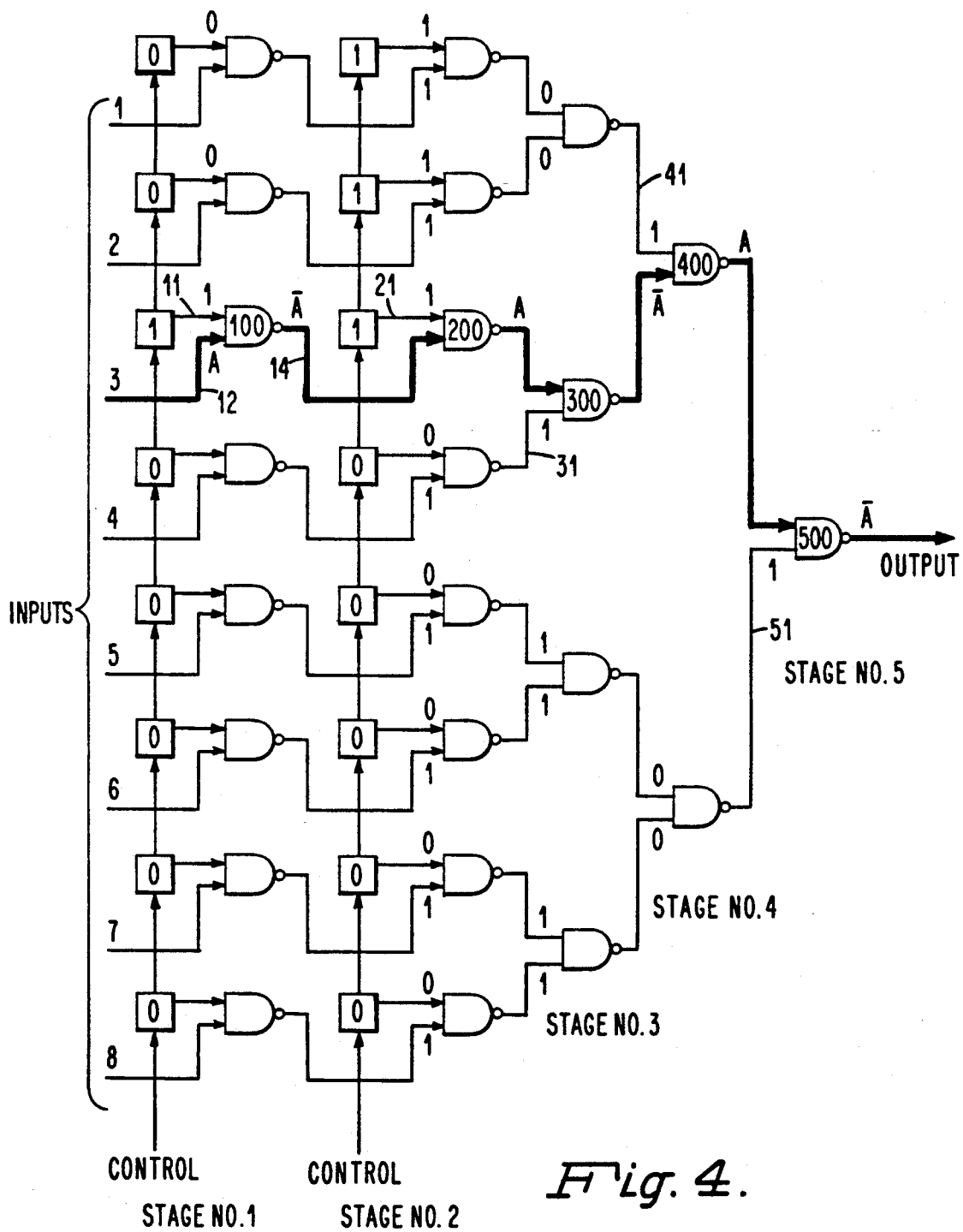
FIG. 4 shows an 8×1 tree-switch matrix in accordance with a preferred embodiment of the present invention.

FIG. 4 is a preferred embodiment of the tree-switch matrix in accordance with the present invention. Even though an 8×1 matrix is shown for exemplary purposes, the array can be easily expanded to include any number of inputs. In order to accommodate multiple outputs, such as in an M×N switch, the desired switch array is formed by driving N M×1 switch arrays in parallel. Further expansion is possible by driving multiple M×N arrays in parallel.

The matrix operates to switch a digital signal entering one of the input ports labeled 1–8 to the output port connected to the output of NAND gate 500 in stage No. 5. The tree-switch is constructed from a plurality of dual-input NAND gates wherein each NAND gate drives only a single NAND gate in a following stage. In the first two stages, each NAND gate receives external control signals at one of its inputs in order to establish a particular switching path in the matrix, whereas the NAND gates in the remaining stages have both of their inputs connected to different NAND gate outputs from a preceding stage and hence have not externally applied control signals other than the signals which are received from the prior stage.

The matrix in FIG. 4 establishes a desired connection by sensitizing only the selected switching path. In other words, only the NAND gates in the selected path are operable to undergo switching, thereby permitting only the input signal entering the selected path to propagate through the switch. Any path can be sensitized by forcing the outputs of stage No. 1 and stage No. 2 to the appropriate states by applying a corresponding combination of control signals to the NAND gates in stages No. 1 and No. 2. The chart below shows the control inputs necessary to achieve a particular output from stage No. 2.

| Input to Stage 1 Gate | Control Input to Stage 1 Gate | Control Input to Stage 2 Gate | Output of Stage 2 Gate |
|---|---|---|---|
| A | HIGH | HIGH | A |
| A | HIGH OR LOW | LOW | HIGH |
| A | LOW | HIGH | LOW |

The appropriate control signals applied to stages No. 1 and No. 2 ensure that for each NAND gate in the selected path, the input line which is not carrying the selected signal is in a HIGH logic state. For example, the darkened switching path in FIG. 4 corresponding to the switching path for signal A is established by maintaining a HIGH logic state level on the inputs 11, 21, 31, 41, and 51 of the gates 100, 200, 300, 400, and 500, respectively. When the switch is operating, the control signals indicated place HIGH state logic signals on select inputs 11 and 21 while forcing the outputs of each other NAND gate in the switch into a particular steady-state value such that inputs 31, 41, and 51 are placed in a HIGH state. The information provided in the chart above plus the output conditions of all stages necessary to establish any particular switching path are sufficient to determine the correspondingly appropriate combination of control signals to apply to stages No. 1 and No. 2. Although a shift register is shown in FIG. 4 to indicate how the control signals are presented to the first and second stage of the switch, other means for applying control signals would be obvious to those skilled in the art.

As mentioned hereinabove, the unique feature of the tree-switch in FIG. 4 is that the only gates that switch and dissipate power are the gates in the sensitized path, namely gates 100, 200, 300, 400, and 500 for the path traversed by signal A. The remaining gates are either in a HIGH or LOW state in accordance with the control signals, thereby dissipating only standby power which is in the microwatt range for NAND gates implemented with CMOS technology. In this particular 8-input case, 5 out of a total of 23 gates are switched. For an array with 64 inputs, only 8 out of 191 gates would switch. In contradistinction, thirteen gates (including inverters) would be switched for a 64-input array configured like the switch in FIG. 1. Clearly, the reduction in logic gates which a signal must traverse reduces the delay and power dissipation and thereby makes higher propagation speed possible.

What has been shown and described herein are two novel tree-switch matrices as shown in FIGS. 3 and 4 which have improvements to conventional broadband space switch matrices resembling the array of FIG. 1. In one embodiment of the present invention as shown in FIG. 3, each switching node N20 has a first NAND gate cascaded to a second NAND gate, whereas in the prior art switch of FIG. 1 each switching node N2 has a NAND gate cascaded to an inverter. Advantageously, the cascade of NAND gates provides minimum pulse shrinkage. The preferred embodiment in FIG. 4 and the prior art switch in FIG. 1 both provide the following advantages: (1) low power dissipation because only the gates in the sensitized path are switched, and (2) high speed because each gate drives only one load. The FIG. 4 switch, however, has the following advantages over the FIG. 1 switch: (1) approximately half the number of stages are in the switching path thereby providing less delay, higher throughput speed, and half the power dissipation, and (2) the total delay for positive and negative input transitions is the same even though the rise and fall delay of the NAND gates is not equal, thereby preventing pulse shrinkage and resulting in higher operational speed. Although the switch in FIG. 1 has simplified control, this is not a critical performance parameter when fast control is not a requirement. Furthermore, the number of control lines is not a significant concern since the lines are only a small part of the chip real estate.

The architectures according to the present invention are not limited to CMOS implementation, and hence the means for establishing a desired switching path in accordance with the requirements described hereinabove accompanying the embodiments of FIGS. 3 and 4 are applicable to other switch configurations which utilize different logic gates that are appropriate for the particular technology. For example, a tree-switch that is constructed from logic gates other than NAND gates might be a more advantageous design, but this embodiment still falls within the scope of the present invention since a switching path is established in the same manner as set forth in the appended claims and the supporting specification. Because CMOS is the preferred technology for the switch array disclosed herein, the use of NAND gates is determined by the fact that the fastest gate in CMOS is the NAND gate.

What is claimed is:

1. A switch for receiving a plurality of input signals through input ports and switching a one of said signals to an output port, comprising:
    a first selection stage comprising a plurality of NAND gates each having a data input connected to a corresponding one of said input ports, a control input, and an output;
    a second selection stage cascaded to said first selection stage and comprising an identical number of NAND gates as said first selection stage, wherein each NAND gate in said second selection stage has a control input, an output, and a data input connected to a respective NAND gate output from said first selection stage;
    a plurality of switching nodes arranged into a multistage tree-multiplexer wherein a first multiplexing stage of said tree-multiplexer is coupled to said second selection stage;
    each switching node of said tree-multiplexer consisting essentially of a single NAND gate having an output, and having a first and second data input each connected to a correspondingly respective NAND gate output from an immediately preceding stage; and
    said matrix being operable in response to control signals applied to the control inputs of said NAND gates in said first and second selection stages for selectably sensitizing a single switching path between a selected input port and said output port of said switch, whereby only those NAND gates in said sensitized path are operable to undergo switching.

2. A switch for receiving a plurality of input signals through input ports and switching a one of said signals to an output port, comprising:
   a first selection stage comprising a plurality of logic gates each having a data input connected to a corresponding one of said input ports, a control input, and an output;
   a second selection stage cascaded to said first selection stage and comprising an identical number of logic gates as said first selection stage, wherein each logic gate in said second selection stage has a control input, an output, and a data input connected to a respective logic gate output from said first selection stage;
   a plurality of switching nodes arranged into a multi-stage tree-multiplexer wherein a first multiplexing stage of said tree-multiplexer is coupled to said second selection stage;
   each switching node of said tree-multiplexer consisting essentially of a single logic gate having an output, and having a first and second data input each connected to a correspondingly respective logic gate output from an immediately preceding stage; and
   said switch being operable in response to control signals applied to the control inputs of said logic gates in said first and second selection stages for selectably sensitizing a single switching path between a selected input port and said output port of said switch, whereby only those logic gates in said sensitized path are operable to undergo switching.

3. The tree-switch matrix as recited in claim 2 wherein:
   said logic gates in said first and second selection stages being NAND gates; and
   said logic gates in said multiplexing configuration being NAND gates.

* * * * *